US011405571B2

(12) United States Patent
Ikeda

(10) Patent No.: US 11,405,571 B2
(45) Date of Patent: Aug. 2, 2022

(54) SOLID-STATE IMAGING APPARATUS AND ELECTRONIC APPARATUS

(71) Applicant: SONY SEMICONDUCTOR SOLUTIONS CORPORATION, Kanagawa (JP)

(72) Inventor: Yusuke Ikeda, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/267,385

(22) PCT Filed: Jul. 25, 2019

(86) PCT No.: PCT/JP2019/029323
§ 371 (c)(1),
(2) Date: Feb. 9, 2021

(87) PCT Pub. No.: WO2020/036051
PCT Pub. Date: Feb. 20, 2020

(65) Prior Publication Data
US 2021/0297623 A1 Sep. 23, 2021

(30) Foreign Application Priority Data

Aug. 17, 2018 (JP) .............................. JP2018-153508
Nov. 8, 2018 (JP) .............................. JP2018-210836

(51) Int. Cl.
*H04N 5/3745* (2011.01)
*H04N 5/369* (2011.01)
(Continued)

(52) U.S. Cl.
CPC ....... *H04N 5/37455* (2013.01); *H04N 5/3698* (2013.01); *H04N 5/3741* (2013.01)

(58) Field of Classification Search
None
See application file for complete search history.

(56) References Cited

U.S. PATENT DOCUMENTS

2014/0191890 A1* 7/2014 Spinks .................... H03M 1/10
341/120
2016/0156868 A1 6/2016 Yamazaki et al.
2019/0104273 A1 4/2019 Sato et al.

FOREIGN PATENT DOCUMENTS

CN 104469202 A 3/2015
CN 108781084 A 11/2018
(Continued)

OTHER PUBLICATIONS

International Search Report and Written Opinion of PCT Application No. PCT/JP2019/029323, dated Oct. 21, 2019, 10 pages of ISRWO.

*Primary Examiner* — Mark T Monk
(74) *Attorney, Agent, or Firm* — Chip Law Group

(57) ABSTRACT

Changing the analog gain for each of columns while suppressing an expansion of area and an increase in power consumption. A solid-state imaging apparatus (1, 1A) according to an embodiment includes: converters (10A to 10D) connected to a vertical signal line (VSL) extending from a pixel array unit (30); a voltage generator (20) that is connected to a plurality of voltage lines and outputs reference voltages having mutually different voltage values individually to the plurality of voltage lines; wiring lines (L10 to L31, L20 to L23) connecting the converter and the plurality of voltage lines; and switches (SW0 to SW3) provided on the wiring line and configured to perform changeover of the voltage lines connected to the converter to one of the plurality of voltage lines.

14 Claims, 13 Drawing Sheets

(51) Int. Cl.
*H04N 5/374* (2011.01)
*H04N 9/04* (2006.01)

(56) References Cited

FOREIGN PATENT DOCUMENTS

| | | |
|---|---|---|
| DE | 102014218431 A1 | 3/2015 |
| GB | 2520142 A | 5/2015 |
| JP | 2008-141609 A | 6/2008 |
| JP | 2010-068048 A | 3/2010 |
| JP | 2015-061135 A | 3/2015 |
| WO | 2016/027683 A1 | 2/2016 |
| WO | 2017/169724 A1 | 10/2017 |

* cited by examiner

FIG.3

| READOUT PIXEL | R | Gr | Gb | B |
|---|---|---|---|---|
| CNTL[1;0] | 0 | 1 | 2 | 3 |
| ANALOG GAIN | 6dB | 0dB | 0dB | 6dB |

FIG.4

| READOUT PIXEL | LONG ACCUMULATION | INTERMEDIATE ACCUMULATION | SHORT ACCUMULATION | SHORT ACCUMULATION |
|---|---|---|---|---|
| CNTL[1;0] | 0 | 1 | 2 | 3 |
| ANALOG GAIN | 12dB | 6dB | 0dB | 12dB |

FIG.6

| READOUT PIXEL | R | Gr | Gb | B |
|---|---|---|---|---|

| CNTL1[1;0] | 0 |
|---|---|

| CNTL2[1;0] | 1 |
|---|---|

| EVEN-NUMBERED COLUMN | 0dB |
|---|---|

| ODD-NUMBERED COLUMN | 6dB |
|---|---|

SOLID-STATE IMAGING APPARATUS AND ELECTRONIC APPARATUS

CROSS REFERENCE TO RELATED APPLICATIONS

This application is a U.S. National Phase of International Patent Application No. PCT/JP2019/029323 filed on Jul. 25, 2019, which claims priority benefit of Japanese Patent Application No. JP 2018-153508 filed in the Japan Patent Office on Aug. 17, 2018 and Japanese Patent Application No. JP 2018-210836 filed in the Japan Patent Office on Nov. 8, 2018. Each of the above-referenced applications is hereby incorporated herein by reference in its entirety.

FIELD

The present disclosure relates to a solid-state imaging apparatus and an electronic apparatus.

BACKGROUND

In recent years, a Complementary Metal-oxide Semiconductor (CMOS) type solid-state imaging apparatus (hereinafter, also referred to as a CMOS image sensor or a CMOS-type solid-state imaging apparatus) has attracted attention as an image sensor to replace a Charge Coupled Device (CCD) type solid-state imaging apparatus.

There are two types of analog-to-digital converters (hereinafter referred to as ADCs) for CMOS solid-state imaging apparatuses: a pipeline-type ADC and a column-type ADC. In addition, the column-type ADC (hereinafter referred to as the column ADC) includes: a single-slope integration type ADC that uses a ramp-shaped reference signal; and a Successive Approximation Register (hereinafter referred to as SAR) type ADC that changes the reference voltage bit by bit. The SAR type column ADC is advantageous in that the AD conversion period can be dramatically shortened as compared with the single-slope integration type column ADC.

CITATION LIST

Patent Literature

Patent Literature 1: JP 2008-141609 A
Patent Literature 2: WO 2016/027683 A

SUMMARY

Technical Problem

Conventionally, in order to widen the dynamic range of the solid-state imaging apparatus, there is a case, for example, where an analog gain of the column ADC is changed for each of colors or for each of unit pixels having different accumulation times. Unfortunately, however, in the case of a single-slope integration type column ADC, there is a need to change the slope of the ramp-shaped reference signal. Therefore, in order to change the slope of the reference signal for each of column ADCs in a single-slope integration type column ADC, there is a need to generate a plurality of reference signals having different slopes, which leads to problems of enlargement of the scale of the circuit that generates the reference signal and an increase in power consumption.

In view of this situation, the present disclosure proposes a solid-state imaging apparatus and an electronic apparatus capable of changing the analog gain for each of column ADCs while suppressing an enlargement of area and an increase in power consumption.

Solution to Problem

To solve the above-described problem, a solid-state imaging apparatus according to one aspect of the present disclosure comprises: a converter connected to a vertical signal line extending from a pixel array unit; a voltage generator that is connected to a plurality of voltage lines and outputs reference voltages having mutually different voltage values individually to the plurality of voltage lines; wiring lines connecting the converter and the plurality of voltage lines; and a switch provided on the wiring line and configured to perform changeover of the voltage lines connected to the converter to one of the plurality of voltage lines.

(Action) With the solid-state imaging apparatus according to the present disclosure, the voltage generator outputs a plurality of reference voltages having different voltage values, and changeover of the reference voltage supplied to the converter is performed by using switches. Such a configuration will eliminate a need to provide voltage generators individually for the voltage values of the reference voltage, making it possible to change the analog gain for each of converters while suppressing an expansion of the area and an increase in power consumption. This leads to effective usage of the dynamic range of each of the converters.

Advantageous Effects of Invention

According to the present disclosure, it is possible to change the analog gain for each of column ADCs while suppressing an expansion of the area and an increase in power consumption. Note that the effects described herein are not necessarily limited and may be any of the effects described in the present disclosure.

BRIEF DESCRIPTION OF DRAWINGS

FIG. 3 is a diagram illustrating changeover of analog gain according to a first example of the first embodiment.

FIG. 4 is a diagram illustrating changeover of analog gain according to a second example of the first embodiment.

FIG. 6 is a diagram illustrating changeover of analog gain according to the second embodiment.

DESCRIPTION OF EMBODIMENTS

Figure 1:
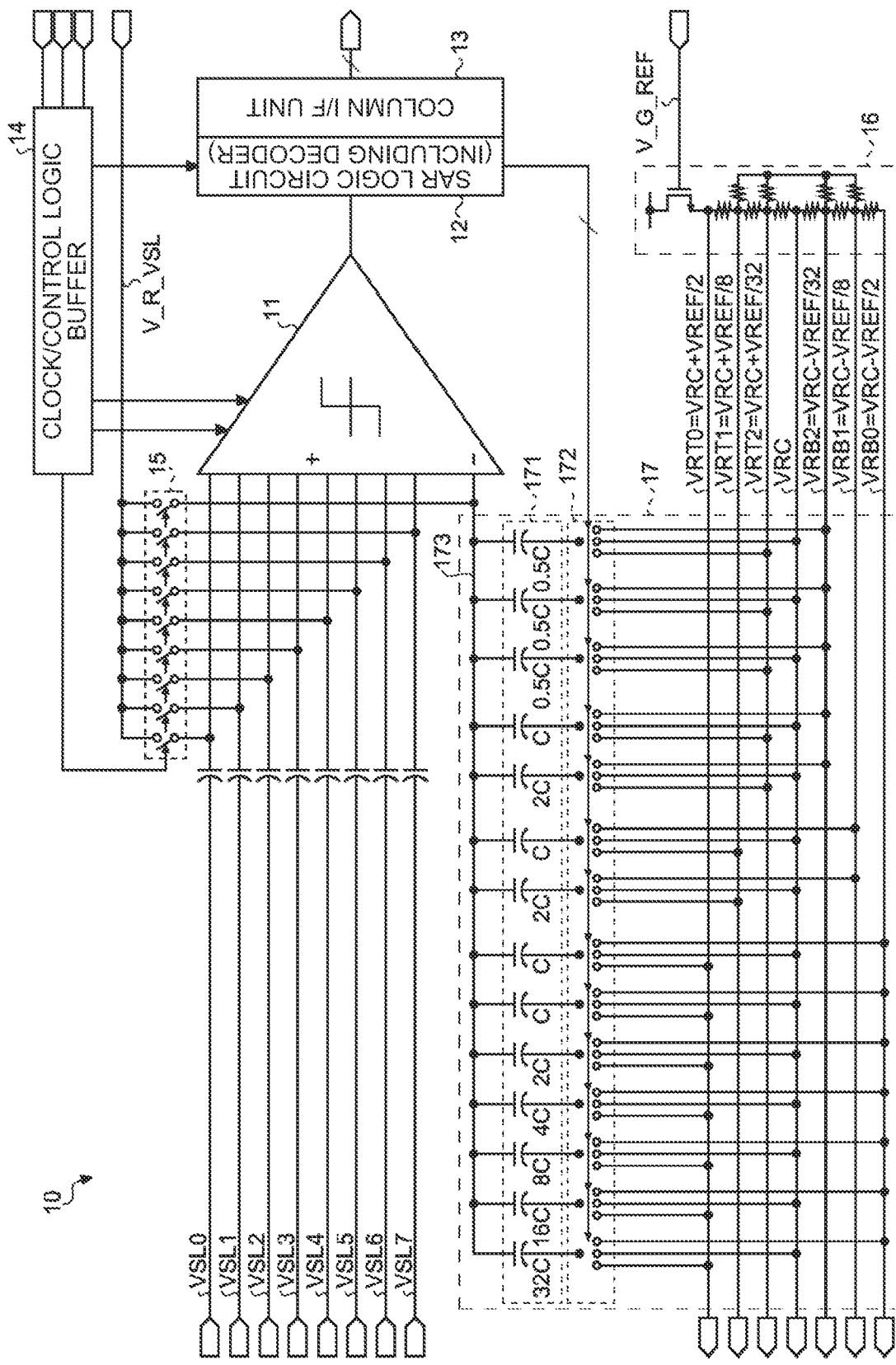
FIG. 1 is a circuit diagram illustrating a schematic configuration example of a column ADC in the solid-state imaging element according to a first embodiment.

An embodiment of the present disclosure will be described below in detail with reference to the drawings. In each of the following embodiments, the same parts are denoted by the same reference symbols, and a repetitive description thereof will be omitted.

The present disclosure will be described in the following order.

1. First Embodiment
1.1 Column ADC configuration
1.2 Outline of operation of column ADC
1.3 Example of configuration for performing changeover of analog gain
1.4 Specific example of changeover of analog gain
1.4.1 First example
1.4.2 Second example
1.5 Action/effect
2. Second Embodiment
2.1 Example of configuration for performing changeover of analog gain
2.2 Specific example of changeover of analog gain
2.3 Grouping
3. Third Embodiment
3.1 Example of configuration for performing changeover of analog gain
3.2 Specific example of changeover of analog gain
4. Fourth Embodiment
4.1 Modification
5. Fifth Embodiment
6. Sixth Embodiment
6.1 First example
6.2 Second example
6.3 Third example
6.4 Fourth example
7. Application to indirect TOF distance image sensor
7.1 System configuration example
7.2 Pixel circuit configuration example 1. First Embodiment First, a solid-state imaging apparatus and an electronic apparatus equipped with the solid-state imaging apparatus according to a first embodiment will be described in detail with reference to the drawings.

1.1 Column ADC Configuration

FIG. 1 is a circuit diagram illustrating a schematic configuration example of a column ADC in a CMOS type solid-state imaging element (hereinafter, simply referred to as a solid-state imaging apparatus) according to the present embodiment. As illustrated in FIG. 1, a column ADC 10 includes a comparator 11, an SAR logic circuit 12, a column interface (I/F) unit 13, a clock/control logic buffer 14, a switch group 15, a reference voltage generation circuit 16, and a Digital-to-Analog (DA) conversion circuit 17. An analog pixel signal is input to the column ADC 10 via vertical signal lines VSL0 to VSL8 connected to each of unit pixels in a pixel array unit (not illustrated).

The clock/control logic buffer 14 converts an externally input master clock, for example, generates a reference clock for the operation of individual parts in the column ADC 10, and then inputs the generated clock to the comparator 11 and the SAR logic circuit 12.

The reference voltage generation circuit 16 is a voltage divider circuit, for example, and divides, using a resistive voltage divider, the reference voltage V_G_REF input from the outside resistors and thereby generates reference voltages having a plurality of voltage values, namely, VRT0 to VRT2, VRC, and VRB0 to VRB2.

The DA conversion circuit 17 performs changeover of the connection of individual switches in a switch group 172 under the control of the SAR logic circuit 12 described below, and thereby controls the connection relationship between a wiring line of each of the plurality of reference signals VRT0 to VRT2, VRC, and VRB0 to VRB2 generated by the reference voltage generation circuit 16 and each of capacitors in a capacitor group 171. In accordance with the connection relationship, the reference voltage for successive approximation (hereinafter referred to as SAR reference voltage) that has emerged in wiring 173 is input to an inverting input terminal of the comparator 11.

An analog pixel signal is input to a non-inverting input terminal of the comparator 11 via a vertical signal line VSL connected to the unit pixel selected from the vertical signal lines VSL0 to VSL8. The comparator 11 performs successive approximation on the pixel signal input to the non-inverting input terminal with the SAR reference voltage input to the inverting input terminal, and outputs the result to the SAR logic circuit 12.

The SAR logic circuit 12 registers the comparison result input from the comparator 11 as a bit value to a register (not illustrated), and generates a control signal to control the switch group 172 of the DA conversion circuit 17 based on the bit value registered in the register.

The switch group 15 includes a plurality of switches, and selectively applies a reset voltage V_R_VSL of the comparator 11 input from the outside to one of the vertical signal lines VSL0 to VSL8 based on the control signal input from the clock/control logic buffer 14. Therefore, the reset voltage V_R_VSL will be input to the inverting input terminal of the comparator 11 via the switch selected by the clock/control logic buffer 14.

1.2 Outline of Operation of Column ADC

Next, an outline of operation of the column ADC10 will be described. For simplification, the following will describe a case where pixel data which is the AD conversion result of the column ADC10 is 8 bits (specifically, 7th bit (Most Significant Bit (MSB)) to 0th bit (Least Significant Bit (LSB)).

The column ADC10 performs successive approximation on the 7th bit, which is the most significant bit, to the 0th bit (−1st bit, as necessary), which is the least significant bit, of the pixel data obtained as the AD conversion result, and thereby determines the value ('1' or '0') for all bits.

First, based on the definition of the 7th bit as a comparison target bit, the SAR logic circuit 12 sets '1' to the 7th bit of a register (not illustrated), and sets '0' to the other bits, namely, 6th to 0th bits. Subsequently, the circuit inputs a 13-bit control signal corresponding to the set value of the 7th bit to the 0th bit to the switch group 172 of the DA conversion circuit 17. With this operation, a SAR reference voltage corresponding to the connection relationship of the switch group 172 emerges in the wiring 173 of the DA conversion circuit 17, and the SAR reference voltage that has emerged will be input to the inverting input terminal of the comparator 11.

On the other hand, an analog pixel signal is input to the non-inverting input terminal of the comparator 11 via one of the vertical signal lines VSL0 to VSL8. The comparator 11 compares the pixel signal input to the non-inverting input terminal with the SAR reference voltage input to the inverting input terminal, and determines whether the voltage value of the pixel signal is the SAR reference voltage or more. Subsequently, the comparator 11 outputs the comparison result to the SAR logic circuit 12.

When the voltage value of the pixel signal is the SAR reference voltage or more, the SAR logic circuit 12 determines the bit value of the comparison target bit (7th bit) as '1' and then registers the value '1' to the register. In contrast, when the voltage value of the pixel signal is less than the SAR reference voltage, the SAR logic circuit 12 determines the bit value of the comparison target bit (7th bit) as '0' and then registers the value '0' to the register.

Hereinafter, the SAR logic circuit 12 executes similar operations for the 6th bit to the 0th bit, thereby registering bit values of individual bits to the register of the SAR logic circuit 12.

In this manner, after the bit values of all the bits have been registered in the register, the SAR logic circuit 12 outputs a digital pixel signal including the registered bit values as the AD conversion result via the column I/F unit 13.

1.3 Example of Configuration for Performing Changeover of Analog Gain

Subsequently, an example of a configuration for performing changeover of analog gains for individual column ADCs 10 will be described in detail with reference to the drawings below.

By changing the voltage value of the reference voltage VREF, the SAR type column ADC10 can change the dynamic range of the voltage and can thereby perform changeover of the analog gain of the column ADC10.

Figure 2:
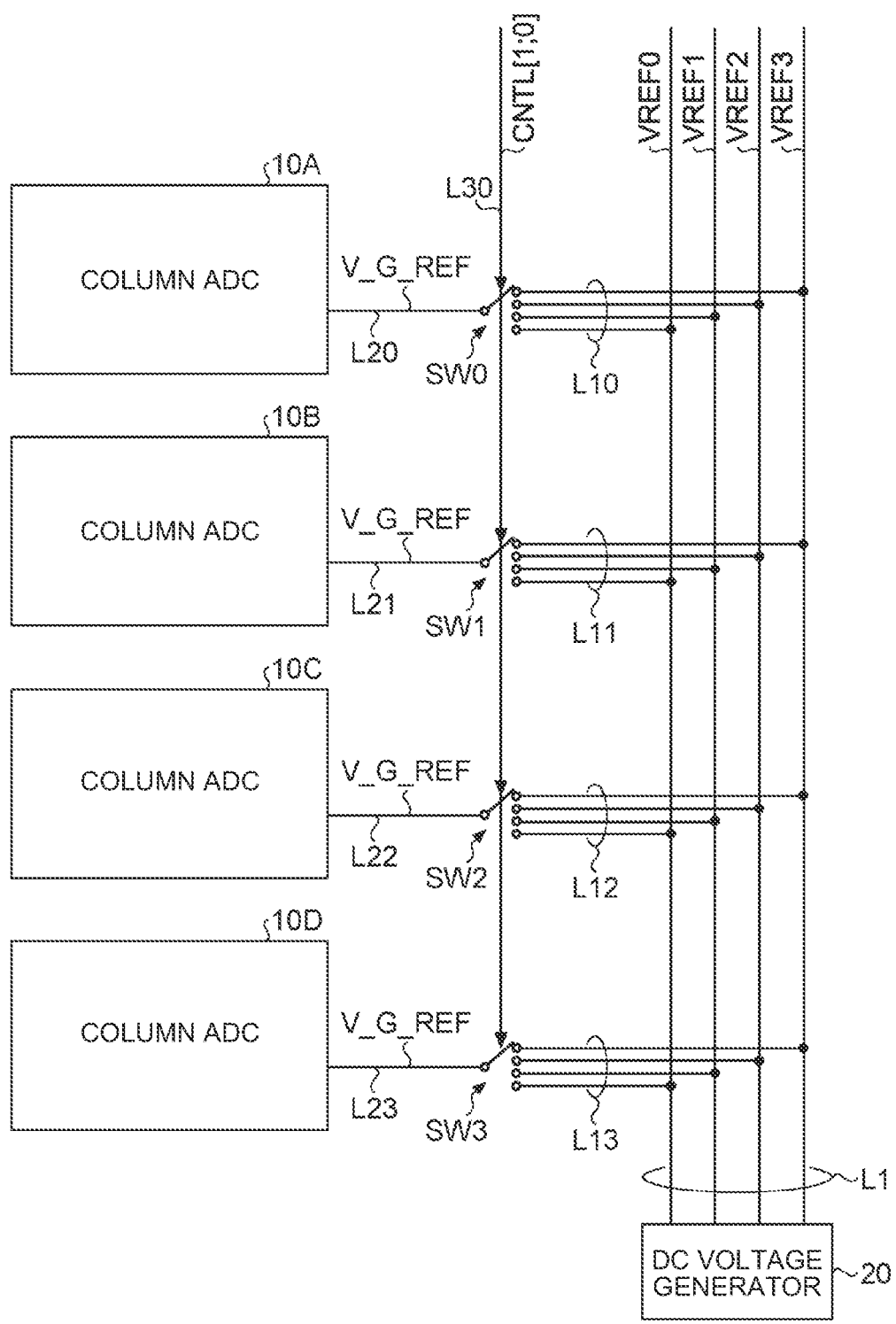
FIG. 2 is a diagram illustrating an example of a connection configuration from a DC voltage generator to a column ADC in the solid-state imaging apparatus according to the first embodiment.

FIG. 2 is a diagram illustrating an example of a connection configuration from a DC voltage generator to a column ADC in a solid-state imaging apparatus according to the present embodiment. Note that FIG. 2 illustrates a case where there are four column ADCs 10 (column ADCs 10A to 10D).

As illustrated in FIG. 2, a DC voltage generator 20 according to the present embodiment outputs a plurality of (four in this example) reference voltages VREF0 to VREF3 having mutually different voltage values. The DC voltage generator 20 is connected to a plurality of voltage lines L1 to which reference voltages VREF0 to VREF3 are individually applied.

The plurality of voltage lines L1 is branched into wiring lines L10 to L13 provided for column ADCs 10A to 10D, respectively, each of the wiring lines L10 to L13 being connected to one of switches SW0 to SW3. Furthermore, each of the switches SW0 to SW3 are connected to one of the corresponding column ADCs 10A to 10D via one of the wiring lines L20 to L23.

The switches SW0 to SW3 perform changeover of their connection relationships based on a selection control signal CNTL output from a control circuit (not illustrated) to the control line L30. The changeover of each of the switches SW0 to SW3 may be performed independently for each of the switch SW0 to SW3, or may be performed collectively per group. For example, when performing changeover independently in the individual switches SW0 to SW3, the selection control signal CNTL includes a number of bits that can represent a number corresponding to the number of switches SW0 to SW3. For example, when the number of column ADCs 10A to 10D is four and the number of switches SW0 to SW3 is four, the selection control signal CNTL will be a 2-bit signal. In contrast, when performing changeover per group, the selection control signal CNTL includes a number of bits that can represent a number corresponding to the number of groups. For example, when the column ADC10A and the column ADC10C are in a same group while the column ADC10B and the column ADC10D are in a same group, that is, when the column ADCs 10A to 10D are grouped into two groups, the selection control signal CNTL will be a 1-bit signal.

The reference voltages VREF0 to VREF3 of the voltage lines L1 connected via the switches SW0 to SW3 in the connected state and the wiring lines L10 to L13 connected to the switches will be input, as a reference voltage V_G_REF, to the column ADCs 10A to 10D via the wiring lines L20 to L23, respectively. With this configuration, it is possible to perform changeover of the voltage values of the reference voltage V_G_REF input to each of the column ADCs 10A to 10D in accordance with the connection state of each of the switches SW0 to SW3.

In this manner, with a configuration in which the DC voltage generator 20 outputs a plurality of reference voltages VREF0 to VREF3 having different voltage values, and changeover of the reference voltage V_G_REF supplied to each of the column ADCs 10A to 10D is performed by using the switches SW0 to SW3 among the reference voltages VREF0 to VREF3, it is possible to achieve high-speed changeover. This enables high-speed readout of pixel data from the pixel array unit.

1.4 Specific Example of Changeover of Analog Gain

Next, a specific example of performing changeover of analog gains of the column ADC10 will be described with some examples. The following description shall be based on the configuration illustrated in FIG. 2.

1.4.1 First Example

FIG. 3 is a diagram illustrating a first example. For example, when the unit pixel to be read out (hereinafter referred to as a readout pixel) includes four types of pixels, an R pixel, a Gr pixel, a Gb pixel, and a B pixel, the voltage value of the pixel signal read out from the R pixel and the B pixel is typically smaller than the voltage value of the pixel signal read out from the Gr pixel and the Gb pixel. In such a case, changeover of the reference voltage V_G_REF supplied to each of the column ADCs 10 is performed so that the dynamic range of the column ADC 10 connected to the R pixel and the B pixel will be narrower than the dynamic range of the column ADC 10 connected to the Gr pixel and the Gb pixel. With this configuration, as illustrated in FIG. 3, the analog gain of the column ADC10 connected to the R pixel and the B pixel can be set higher than the analog gain of the column ADC10 connected to the Gr pixel and the Gb pixel. Accordingly, it is possible to effectively use the dynamic range of each of the column ADCs for the Gr pixel and the Gb pixel.

1.4.2 Second Example

FIG. 4 is a diagram illustrating a second example. The second example illustrates a case where changeover of the analog gain is performed in accordance with the exposure time for each of readout pixels, that is, with the length of charge accumulation time. For example, in a case where there are both a readout pixel having a long charge accumulation time (hereinafter referred to as long accumulation), a readout pixel having a short charge accumulation time (hereinafter referred to as short accumulation), and a readout pixel having an intermediate charge accumulation time (hereinafter referred to as intermediate accumulation), changeover of the reference voltage V_G_REF supplied to each of the column ADCs 10 is performed so that the dynamic range of the column ADC connected to the long accumulation readout pixel is narrower than the dynamic range of the column ADC 10 connected to the intermediate accumulation readout pixel. With this operation, as illustrated in FIG. 4, the analog gain of the column ADC 10 connected to the long accumulation readout pixel can be set higher than the analog gain of the column ADC 10 connected to the intermediate accumulation readout pixel. Similarly, changeover of the reference voltage V_G_REF supplied to each of the column ADCs 10 is performed so that the dynamic range of the column ADC connected to the intermediate accumulation readout pixel will be narrower than the dynamic range of the column ADC 10 connected to the short accumulation range readout pixel. With this operation, as illustrated in FIG. 4, the analog gain of the column ADC 10 connected to the intermediate accumulation readout pixel can be set higher than the analog gain of the column ADC 10 connected to the short accumulation readout pixel.

In this manner, with a configuration in which changeover of the voltage values of the reference voltage V_G_REF supplied to the column ADC 10 connected to the readout pixel is performed in accordance with the length of the charge accumulation time, it is possible to effectively use the dynamic range of each of the column ADCs, similarly to the first example.

1.5 Action/Effect

As described above, according to the present embodiment, with a configuration in which the DC voltage generator 20 outputs a plurality of reference voltages VREF0 to VREF3 having different voltage values, and changeover of the reference voltage V_G_REF supplied to each of the column ADCs 10A to 10D is performed by using the switches SW0 to SW3 among the reference voltages VREF0 to VREF3. Such a configuration eliminates a need to provide DC voltage generators individually for the voltage values of the reference voltage VREF, making it possible to change the analog gain for each of column ADCs while suppressing an expansion of the area and an increase in power consumption. This makes it possible to realize a solid-state imaging apparatus and an electronic apparatus capable of effectively using the dynamic range of each of the column ADCs.

Furthermore, as in the present embodiment, with a configuration in which changeover of the reference voltages VREF0 to VREF3 is performed by the switches SW0 to SW3, it is possible to achieve high-speed changeover. This enables high-speed readout of pixel data from the pixel array unit.

2. Second Embodiment

Next, a solid-state imaging apparatus and an electronic apparatus equipped with the solid-state imaging apparatus according to a second embodiment will be described in detail with reference to the drawings. The configuration and outline of operation of the column ADC according to the present embodiment may be similar to the configuration example described with reference to FIG. 1 in the first embodiment. Accordingly, detailed description thereof will be omitted here.

2.1 Example of Configuration for Performing Changeover of Analog Gain

Figure 5:
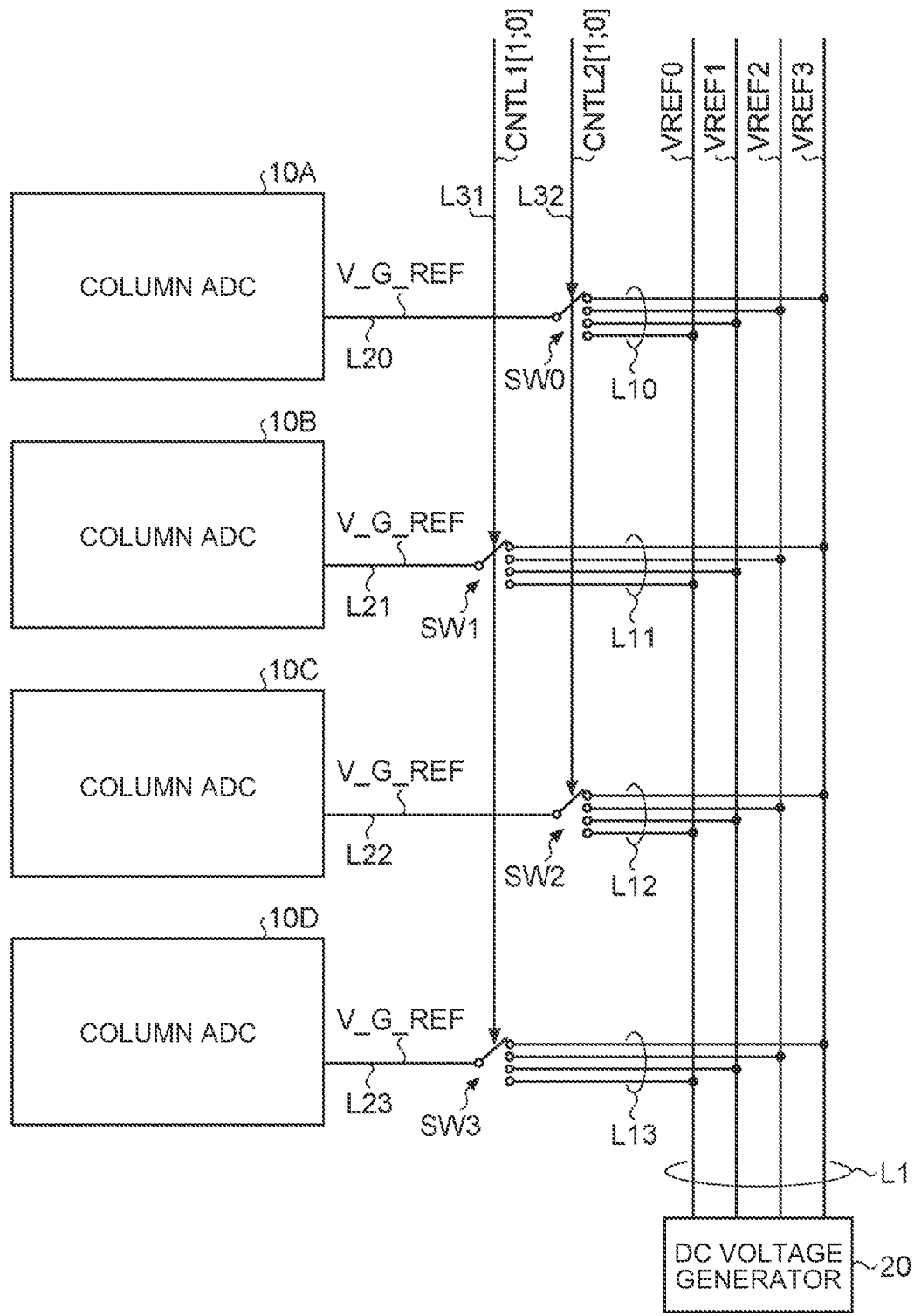
FIG. 5 is a diagram illustrating an example of a connection configuration from a DC voltage generator to a column ADC in a solid-state imaging apparatus according to a second embodiment.

FIG. 5 is a diagram illustrating an example of a connection configuration from a DC voltage generator to a column ADC in a solid-state imaging apparatus according to the present embodiment. Note that FIG. 5 illustrates a case where there are four column ADCs 10 (column ADCs 10A to 10D) similarly to the case of FIG. 2.

As illustrated in FIG. 5, the connection configuration example from the DC voltage generator 20 to the column ADC 10 in the solid-state imaging apparatus according to the present embodiment has a configuration similar to that described with reference to FIG. 2 in the first embodiment, in which the control lines L30 that control switches SW0 to SW3 are divided into a plurality of (two in this example) control lines L31 and L32. The control line L31 has an input of a selection control signal CNTL1 output from a control circuit (not illustrated). The control line L32 has an input of a selection control signal CNTL2 output from the control circuit in a same manner.

The control line L31 is connected to switches SW1 and SW3 of column ADCs 10B and 10D connected to an even-numbered vertical signal line VSL (hereinafter referred to as an even-numbered column), for example, while the control line L32 is connected to switches SW0 and SW2 of column ADCs 10A and 10C connected to an odd-numbered vertical signal line VSL (hereinafter referred to as odd-numbered column), for example.

That is, in the present embodiment, the column ADCs 10A to 10D are grouped into a group including even-numbered column ADCs 10B and 10D and a group including odd-numbered column ADCs 10A and 10C, and individual groups are separately controlled by individual control lines L31 and L32, independently.

With such a configuration, it is possible to perform changeover of the voltage values of the reference voltage V_G_REF supplied to the column ADCs 10 belonging to each of the groups for each of systems. This makes it possible to easily perform changeover of the analog gain of the column ADC 10 on a group-by-group basis.

2.2 Specific Example of Changeover of Analog Gain

Next, a specific example of performing changeover of analog gains of the column ADC10 will be described with some examples. The following description shall be based on the configuration illustrated in FIG. 5.

FIG. 6 is a diagram illustrating a specific example of performing changeover of the analog gain according to the present embodiment. As observed from comparison of FIG. 6 with FIG. 3 or FIG. 4, in the present embodiment, it is possible, for each of readout pixels, in other words, for each of the column ADCs 10, to change the analog gain (denoted as even-numbered column and odd-numbered column in the drawing) of the column ADC 10 belonging to each of groups (for example, even-numbered column group and odd-numbered column group) without performing changeover of the selection control signals CNTL1 and CNTL2 of each of systems for each of the column ADCs 10. This makes it possible to easily perform changeover of the analog gain of the column ADC 10 on a group-by-group basis.

2.3 Grouping

While the above has illustrated a case where the column ADC10 is grouped into the even-numbered column and the odd-numbered column group, the grouping of the column ADC10 is not limited to this case. For example, grouping may be performed in various types of modifications, such that, column ADCs 10 connected to each of the two or vertical signal line VSLs adjacent in a row direction are grouped into one group, or column ADCs 10 connected to each of the vertical signal lines VSLs arranged every three or more lines in a row direction are grouped into one group, or the like.

For example, in a case where the column ADCs 10 connected to two vertical signal lines VSL adjacent to each other in the row direction are grouped into one group, the column ADCs 10 connected to the 4Nth (N is an integer of 1 or more) vertical signal line VSL and the (2N+1)th vertical signal line in the row direction are grouped into the same group, while the column ADCs 10 connected to the (2N+2)th vertical signal line VSL and the (2N+3)th vertical signal line in the row direction are grouped into the same group.

Moreover, for example, in a case where the column ADCs 10 connected to the vertical signal lines VSL arranged every three lines in the row direction are grouped into one group, the column ADCs 10 connected to the 3Nth vertical signal line VSL in the row direction are grouped into one group, the column ADCs 10 connected to the (3N+1)th vertical signal line VSL in the row direction are grouped into one group, and the column ADCs 10 connected to the (3N+2)th vertical signal line VSL in the row direction are grouped into one group.

Since other configurations, operations, and effects may be similar to those in the above-described embodiment, detailed description thereof will be omitted here.

3. Third Embodiment

Next, a solid-state imaging apparatus and an electronic apparatus equipped with the solid-state imaging apparatus according to a third embodiment will be described in detail with reference to the drawings. The configuration and outline of operation of the column ADC according to the present embodiment may be similar to the configuration example described with reference to FIG. 1 in the first embodiment. Accordingly, detailed description thereof will be omitted here.

The above-described embodiment is an exemplary case where a plurality of voltage lines L1 is connected to the DC voltage generator 20, and the DC voltage generator 20 applies reference voltages VREF0 to VREF3 having different voltage values to the individual voltage lines L1. In contrast, in the present embodiment, one voltage line L2 is connected to a DC voltage generator, and the DC voltage generator applies reference voltages VREF0 to VREF3 having different voltage values to the voltage line L2, using changeover of voltages in time division.

3.1 Example of Configuration for Performing Changeover of Analog Gain

Figure 7:
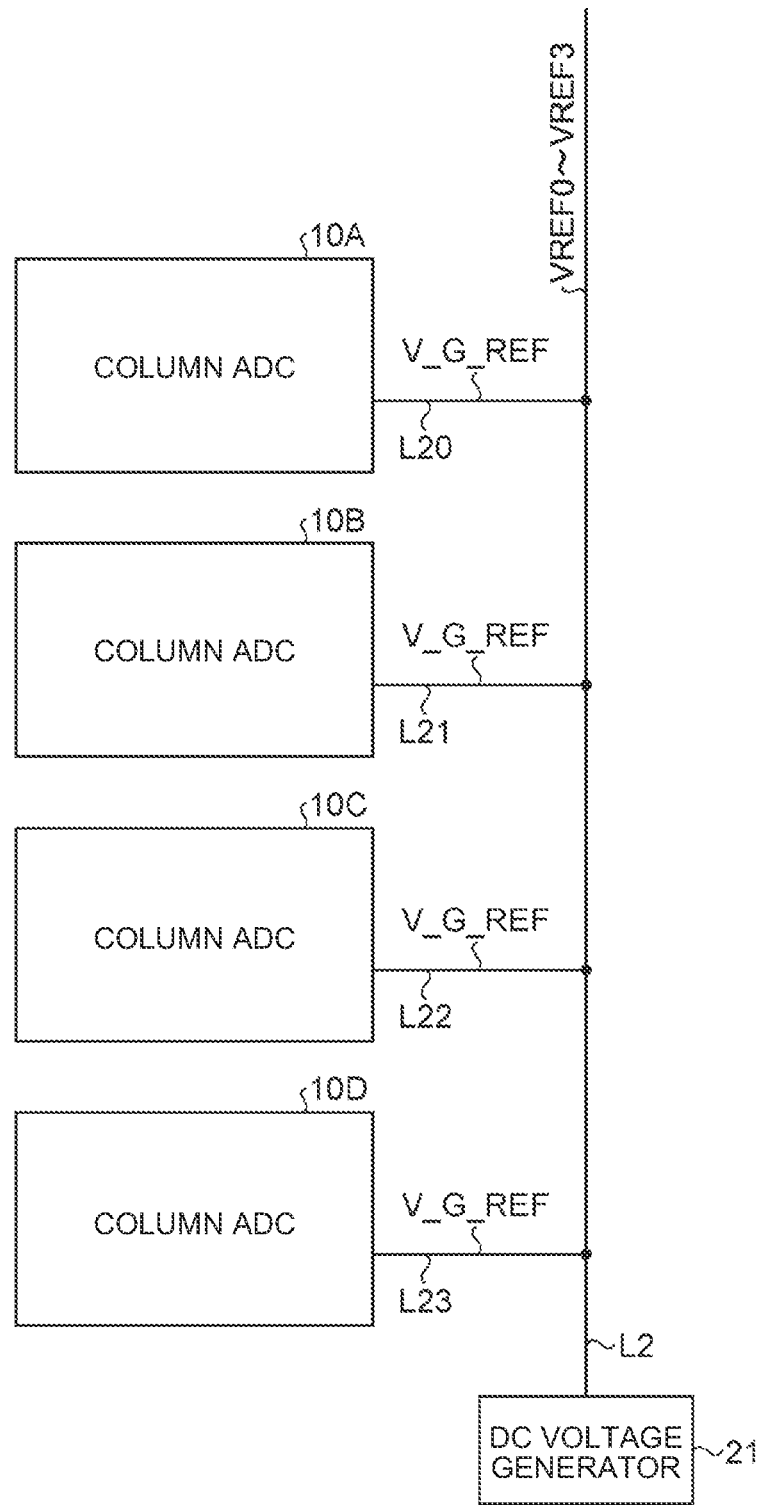
FIG. 7 is a diagram illustrating an example of a connection configuration from a DC voltage generator to a column ADC in a solid-state imaging apparatus according to a third embodiment.

FIG. 7 is a diagram illustrating an example of a connection configuration from a DC voltage generator to a column ADC in a solid-state imaging apparatus according to the present embodiment. Note that FIG. 7 illustrates a case where there are four column ADCs 10 (column ADCs 10A to 10D) similarly to the cases of FIG. 2 or FIG. 5.

As illustrated in FIG. 7, the connection configuration example from a DC voltage generator 21 to the column ADC 10 in the solid-state imaging apparatus according to the present embodiment has a configuration similar to that described with reference to FIG. 2 in the first embodiment, in which the switches SW0 to SW3 are omitted. Furthermore, in this configuration, the plurality of voltage lines L1 connected to the DC voltage generator 21 has been replaced with one voltage line L2, and the wiring lines L20 to L23 connected to individual column ADCs 10A to 10D are branched from the voltage line L2.

In such a configuration, the column ADCs 10A to 10D operate sequentially in time division. The DC voltage generator 21 performs changeover of the output reference voltage VREF to one of the reference voltages VREF0 to VREF3 having different voltage values at the timing of changeover of the operating column ADCs 10A to 10D.

With such a configuration, it is also possible to perform changeover of the voltage values of the reference voltage V_G_REF supplied to each column ADC10.

3.2 Specific Example of Changeover of Analog Gain

Next, a specific example of performing changeover of analog gains of the column ADC10 will be described with some examples. The following description shall be based on the configuration illustrated in FIG. 7.

Figure 8:
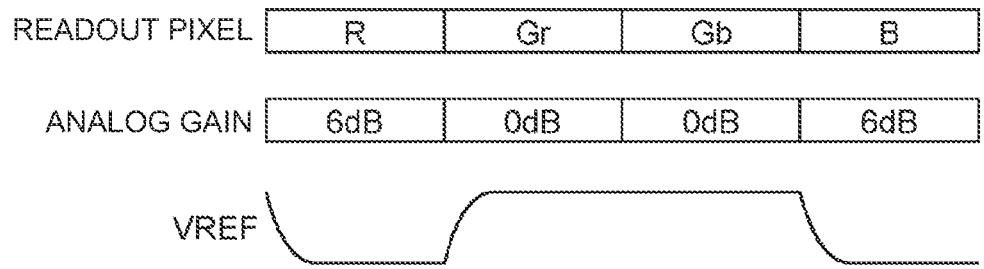
FIG. 8 is a diagram illustrating changeover of analog gain according to the third embodiment.

FIG. 8 is a diagram illustrating a specific example of performing changeover of the analog gain according to the present embodiment. As illustrated in FIG. 8, in the present embodiment, changeover of the voltage value of the reference voltage VREF output from the DC voltage generator 21 is performed for each of readout pixels or for each of groups of readout pixels.

The configuration of performing changeover of the voltage value of the reference voltage VREF in time division as in the present embodiment is not limited to the case where one voltage line L2 is connected to the DC voltage generator 21 is one as illustrated in FIG. 7. Alternatively, as illustrated in FIGS. 2 and 5, for example, the configuration is also applicable to the case where a plurality of voltage lines L1 is connected to the DC voltage generator 20. That is, it is also possible to configure in the first or second embodiment such that changeover of the voltage values of the reference voltages VREF0 to VREF3 supplied to each of the voltage lines L1 by the DC voltage generator 20 is performed in time division.

Since other configurations, operations, and effects may be similar to those in the above-described embodiment, detailed description thereof will be omitted here.

4. Fourth Embodiment

Next, a solid-state imaging apparatus and an electronic apparatus equipped with the solid-state imaging apparatus according to a fourth embodiment will be described in detail with reference to the drawings. In the fourth embodiment, a layout of the configuration according to the above-described embodiment will be described with reference to specific examples.

Figure 9:
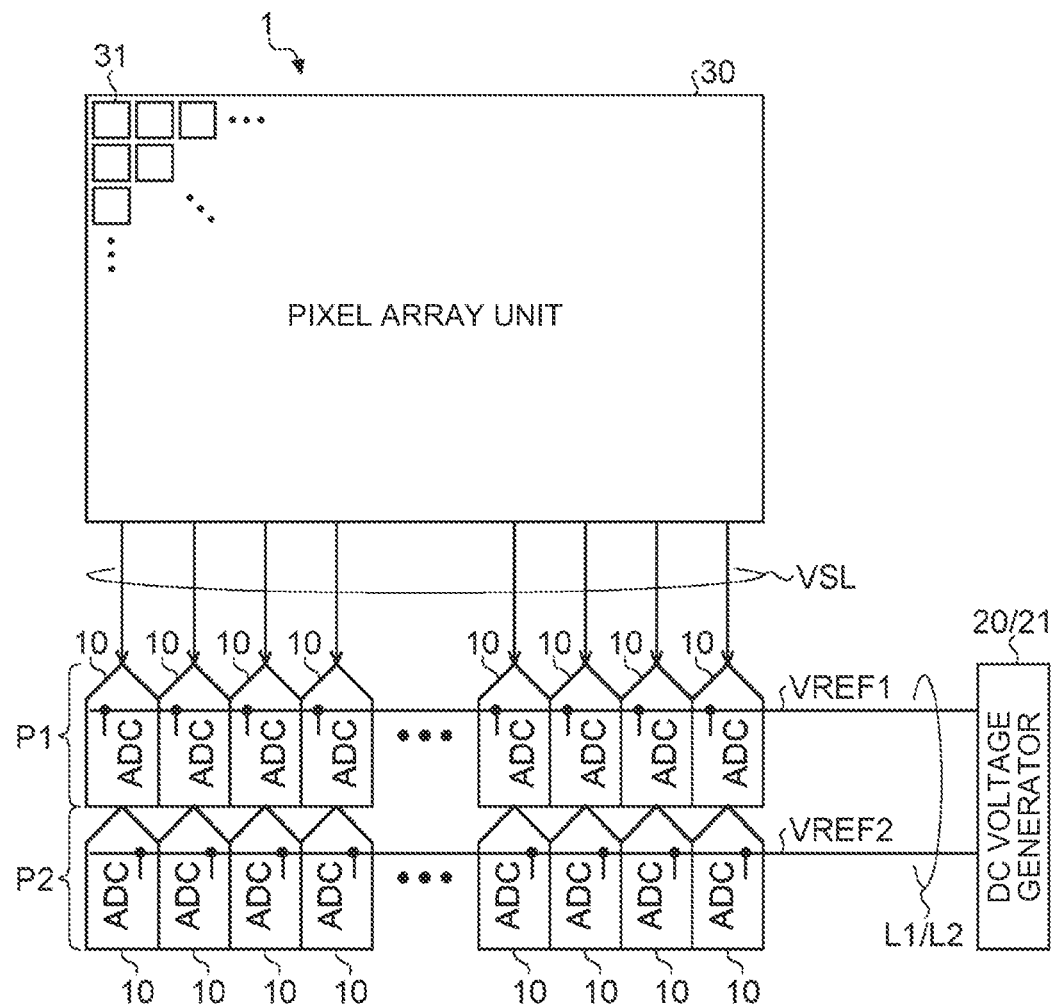
FIG. 9 is a diagram illustrating a layout example of a solid-state imaging apparatus according to a fourth embodiment.

FIG. 9 is a diagram illustrating a layout example of the solid-state imaging apparatus according to the present embodiment. As illustrated in FIG. 9, in the solid-state imaging apparatus, a plurality of column ADCs 10 is arranged with respect to a pixel array unit 30 in which unit pixels 31 including a plurality of photoelectric conversion elements are regularly arranged in a two-dimensional matrix on a semiconductor substrate (for example, a silicon substrate).

The plurality of column ADCs 10 is grouped into two or more groups. The grouping may be the same as the grouping of the column ADC 10 described in the second embodiment, for example. FIG. 9 illustrates an example in which the column ADCs 10 are grouped into a group P1 including column ADCs 10 connected to the even-numbered vertical signal line VSL and a group P2 including column ADCs 10 connected to the odd-numbered vertical signal line VSL.

From the DC voltage generator 20/21, one voltage line L1 for each of systems extends for individual groups P1 and P2. For example, the column ADC 10 belonging to the group P1 is connected to the voltage line L1 to which the reference voltage VREF1 is applied, while the column ADC 10 belonging to the group P2 is connected to the voltage line L1 to which the reference voltage VREF2 is applied.

A vertical signal line VSL connected to the unit pixel 31 in each of rows extends from one side of the pixel array unit 30. The groups P1 and P2 are arranged in a plurality of stages on an extension side of the vertical signal line VSL, with respect to the pixel array unit 30. In an example illustrated in FIG. 9, the group P1 of the column ADC 10 connected to the even-numbered vertical signal line VSL is linearly arranged in the first stage closer to the pixel array unit 30, while the group P2 of the column ADC 10 connected to the odd-numbered vertical signal line VSL is linearly arranged in the second stage, which is the subsequent stage of group P1.

In this manner, with a layout in which the column ADCs 10 are divided into a plurality of stages for each of groups (also referred to as each of systems) and arranged linearly with respect to the pixel array unit 30, and the column ADCs 10 of individual stages are connected to the common voltage line L1, it is possible to simplify the connection configuration from the DC voltage generator 20/21 to the column ADC 10 and simplify the switchover control of the reference voltage VREF performed by the DC voltage generator 20/21.

4.1 Modification

Figure 10:
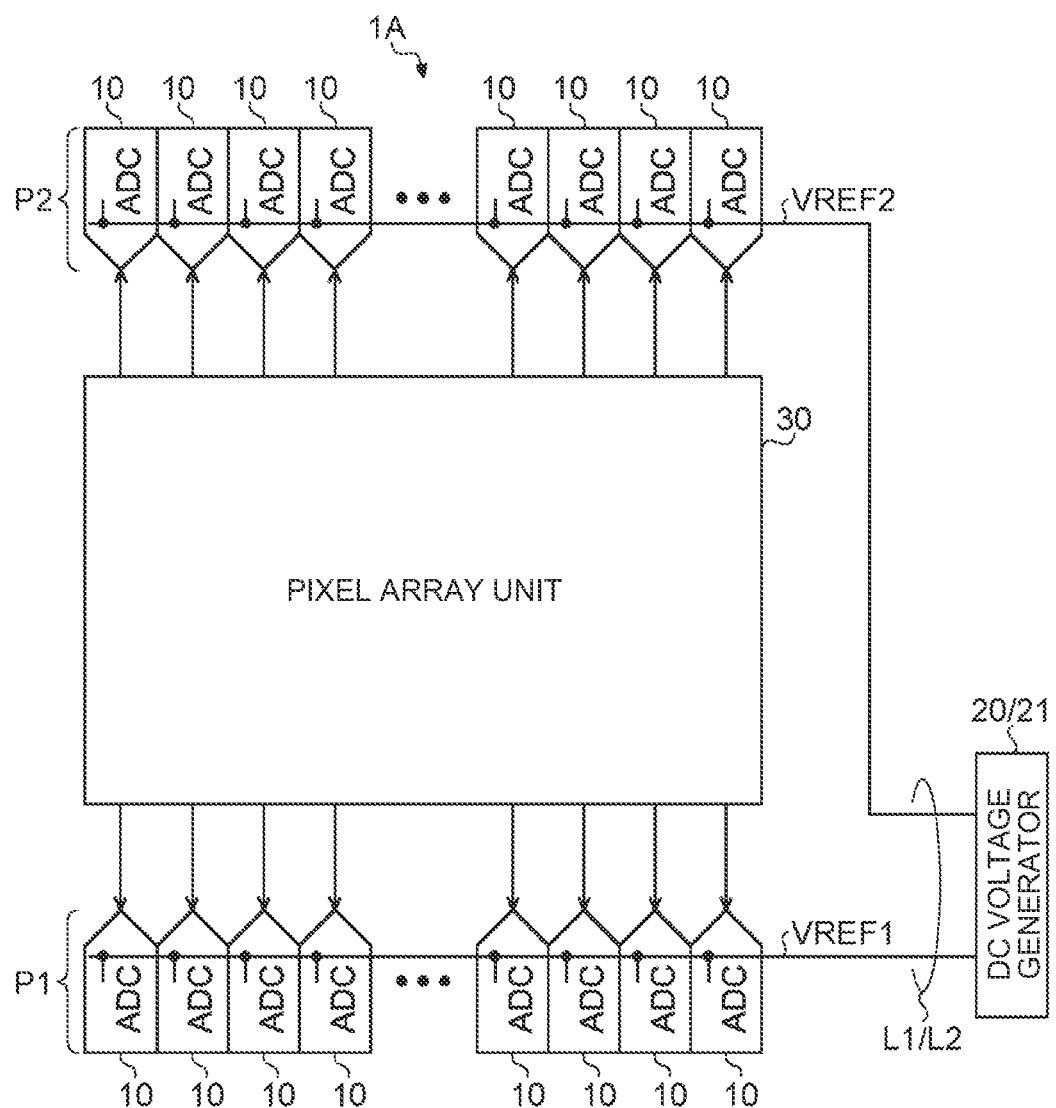
FIG. 10 is a diagram illustrating a schematic configuration example of a solid-state imaging apparatus according to a modification of the fourth embodiment.

FIG. 10 is a diagram illustrating a layout example of the solid-state imaging apparatus according to modifications of the present embodiment. In the layout example illustrated in FIG. 9, the column ADCs 10 are arranged in a plurality of stages for each of systems on one side of the pixel array unit 30. In the modification, as illustrated as a solid-state imaging apparatus 1A in FIG. 10, the groups P1 and P2 are arranged at positions sandwiching the pixel array unit 30. The vertical signal line VSL connected to the unit pixel 31 of each of rows extends from the two sides of the pixel array unit 30 where the groups P1 and P2 are arranged. In the example illustrated in FIG. 10, for example, the vertical signal line VSL connected to the unit pixel 31 of the even-numbered column extends from the lower side in the drawing and is connected to each of the column ADCs 10 of the group P1, while the vertical signal line VSL connected to the unit pixel 31 of the odd-numbered column extends from the upper side in the drawing and is connected to each of the column ADCs 10 of the group P2.

In this manner, with a layout in which the pixel array unit 30 is sandwiched between the column ADCs 10 of each of systems, it is also possible to simplify the connection configuration from the DC voltage generator 20/21 to the column ADC 10 and simplify the changeover control of the reference voltage VREF performed by the DC voltage generator 20/21, similarly to the layout example illustrated in FIG. 9.

5. Fifth Embodiment

Next, a solid-state imaging apparatus and an electronic apparatus equipped with the solid-state imaging apparatus according to a fifth embodiment will be described in detail with reference to the drawings. In the fifth embodiment, a solid-state imaging apparatus having the configuration according to the above-described embodiment will be described with reference to specific examples. In the present embodiment, a solid-state imaging apparatus based on the second embodiment is illustrated. However, the present invention is not limited to this, and other embodiments may be used as the base.

Figure 11:
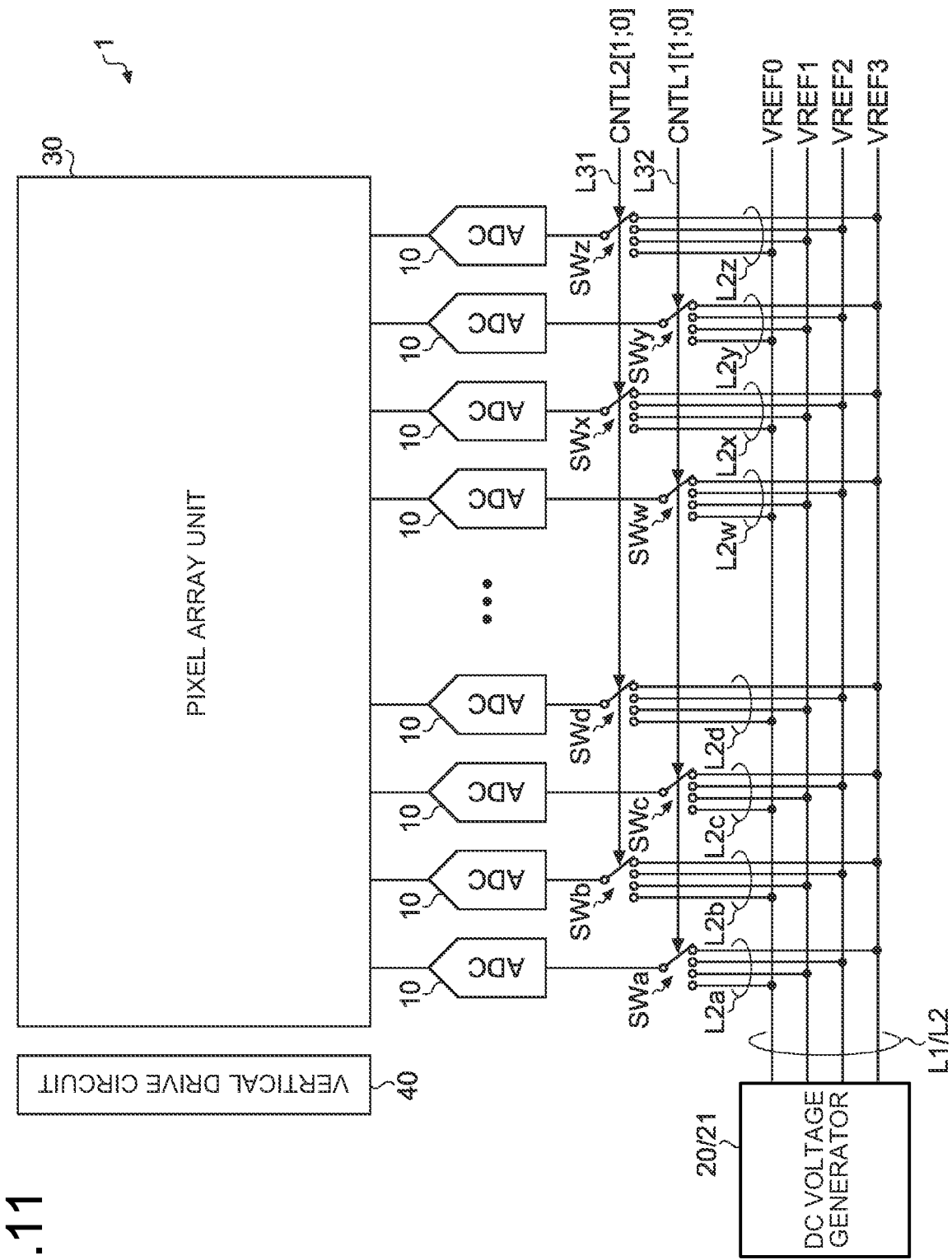
FIG. 11 is a diagram illustrating a schematic configuration example of a solid-state imaging apparatus according to a fifth embodiment.

FIG. 11 is a diagram illustrating a schematic configuration example of a solid-state imaging apparatus according to the present embodiment. As illustrated in FIG. 9, the solid-state imaging apparatus 1 includes a pixel array unit 30 in which unit pixels 31 are regularly arranged in a two-dimensional matrix, and a peripheral circuit unit.

The unit pixel 31 includes a photoelectric conversion element (for example, a photodiode) and a plurality of pixel transistors (for example, MOS transistors). The plurality of pixel transistors can be formed with three transistors, a transfer transistor, a reset transistor, and an amplification transistor, for example. It is also possible to add a selection transistor and configure the pixel transistor with four transistors. Since an equivalent circuit of each of the unit pixels 31 may use the circuit similar to a generic equivalent circuit, detailed description thereof will be omitted here.

Furthermore, the unit pixel 31 may have a shared pixel structure. The pixel sharing structure includes a plurality of photodiodes, a plurality of transfer transistors, one shared floating diffusion, and another shared pixel transistor.

The peripheral circuit unit includes the column ADC 10 and the DC voltage generator 20/21 according to the above-described embodiment. The column ADC 10 is provided for each of vertical signal lines VSL connected to one or more unit pixels 31 arranged in the column direction in the pixel array unit 30, for example. However, in the case of the pixel sharing structure, one column ADC10 is provided for a plurality of vertical signal lines VSL.

In addition, the peripheral circuit unit can include a vertical drive circuit 40, a horizontal drive circuit (not illustrated), an output circuit, a control circuit, or the like.

The control circuit receives an input clock and data that commands an operation mode, or the like, and outputs data such as internal information of the solid-state imaging apparatus 1. Specifically, the control circuit generates a clock signal or a control signal that serves as a reference for the operation of the vertical drive circuit 40, each of the column ADCs 10, and the horizontal drive circuit based on a vertical synchronization signal, a horizontal synchronization signal, and the master clock. The control circuit then inputs these signals to the vertical drive circuit 40, each of the column ADCs 10 and the horizontal drive circuit.

The vertical drive circuit 40 is formed with a shift register, for example, selects pixel drive wiring lines, supplies a pulse for driving the unit pixel 31 to the selected pixel drive wiring line, and drives the unit pixel 31 in units of rows. Specifically, the vertical drive circuit 40 selectively scans each of the unit pixels 31 of the pixel array unit 30 in the units of rows sequentially in the vertical direction, and supplies each of the column ADCs 10 with pixel signals based on the signal charge generated in accordance with received light amount in the photoelectric conversion element of each of the unit pixels 31 through the vertical signal line VSL.

Each of the column ADCs 10 may execute Correlated Double Sampling (CDS) for removing fixed pattern noise peculiar to the unit pixel 31, signal amplification or the like in addition to an AD conversion process of converting the analog pixel signal output from the unit pixel 31 for one row into a digital pixel signal. There is provided a horizontal selection switch (not illustrated) connected between the output stage of each of the column ADCs 10 and a horizontal signal line (not illustrated).

The horizontal drive circuit includes a shift register, for example, and sequentially outputs horizontal scanning pulses to sequentially select each of the column ADCs 10 and performs control to output a pixel signal from each of the column ADCs 10 to the horizontal signal line.

The output circuit performs signal processing on the signals sequentially supplied from each of the column ADCs 10 through the horizontal signal lines and then outputs the processed signals. The output circuit may perform buffering alone, for example, or may also perform black level adjustment, column variation correction, various digital signal processing, or the like.

In the above configuration, it is possible to perform changeover of the switches SWa to SWz that performs changeover of the reference voltages VREF0 to VREF3 supplied to each of the column ADCs 10, that is, the values of the selection control signals CNTL1 and CNTL2, in synchronization with the operation of the vertical drive circuit 40, for example. Specifically, changeover of on/off of each of the switches SWa to SWz, that is, the values of the selection control signals CNTL1 and CNTL2, is performed in synchronization with the timing at which the vertical drive circuit 40 performs changeover of the vertical signal line VSL to be selected. Even when changeover of the voltage values of the reference voltages VREF0 to VREF3 applied to each of the voltage lines L1 by the DC voltage generator 20/21 is performed in time division, the changeover of the voltage values is performed in synchronization with the operation of the vertical drive circuit 40.

As described above, the embodiment described above can be implemented by the configuration in which changeover of the reference voltages VREF0 to VREF3 supplied to the column ADC 10 is performed in synchronization with the operation of the vertical drive circuit 40.

6. Sixth Embodiment

Next, a solid-state imaging apparatus and an electronic apparatus equipped with the solid-state imaging apparatus according to a sixth embodiment will be described in detail with reference to the drawings. In the sixth embodiment, specific examples of the DC voltage generator 20/21 according to the above-described embodiment will be described with some examples.

6.1 First Example

Figure 12:
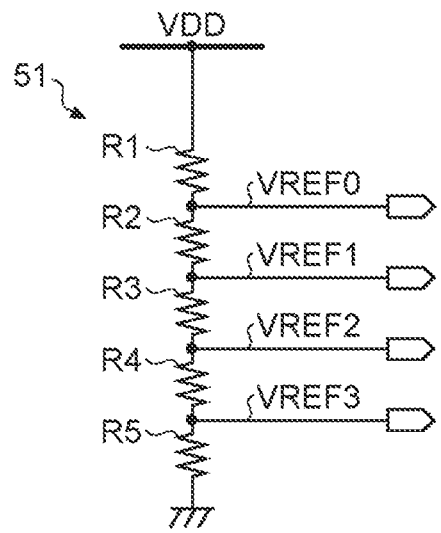
FIG. 12 is a circuit diagram illustrating a schematic configuration example of a DC voltage generation circuit according to a first example of the sixth embodiment.

FIG. 12 is a circuit diagram illustrating a schematic configuration example of a DC voltage generation circuit according to a first example. As illustrated in FIG. 12, a DC voltage generator 51 according to the first example has a configuration of a voltage divider circuit in which a plurality of resistive elements R1 to R5 is connected in series between a power supply voltage VDD and a ground GND. A plurality of reference voltages VREF0 to VREF3 having different voltage values is extracted from a connection portion of each of the resistive elements R1 to R5.

In this manner, with a configuration in which the circuit using resistance voltage division generates a plurality of reference voltages VREF0 to VREF3 having different voltage values, it is possible to change the analog gain for each of column ADCs while suppressing an expansion of the area and an increase in power consumption.

6.2 Second Example

Figure 13:
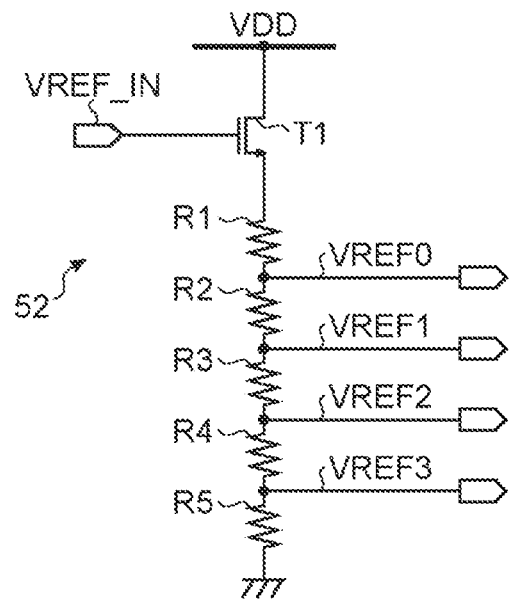
FIG. 13 is a circuit diagram illustrating a schematic configuration example of a DC voltage generation circuit according to a second example of the sixth embodiment.

FIG. 13 is a circuit diagram illustrating a schematic configuration example of a DC voltage generation circuit according to a second example. As illustrated in FIG. 13, a DC voltage generator 52 according to the second example has a configuration similar to the case of the DC voltage generator 51 according to the first example, in which an NMOS transistor T1 is connected in series between the power supply voltage VDD and the plurality of resistive elements R1 to R5. In the NMOS transistor T1, the drain is connected to the power supply voltage VDD, for example, and the source is connected to the resistive element R1. Furthermore, for example, a separately generated reference voltage VREF_IN is input to a gate of the NMOS transistor T1.

In this manner, with a configuration in which the NMOS transistor T1 is arranged between the resistive elements R1 to R5 and the power supply voltage VDD, changing the constant of the NMOS transistor T1 or the voltage value of the reference voltage VREF input to the gate of the NMOS transistor T1 makes it possible to change the voltage values of the reference voltages VREF0 to VREF3 extracted from each of connection portions of the resistive elements R1 to R5. The other configurations may be similar to those of the DC voltage generator 51 according to the first example.

6.3 Third Example

Figure 14:
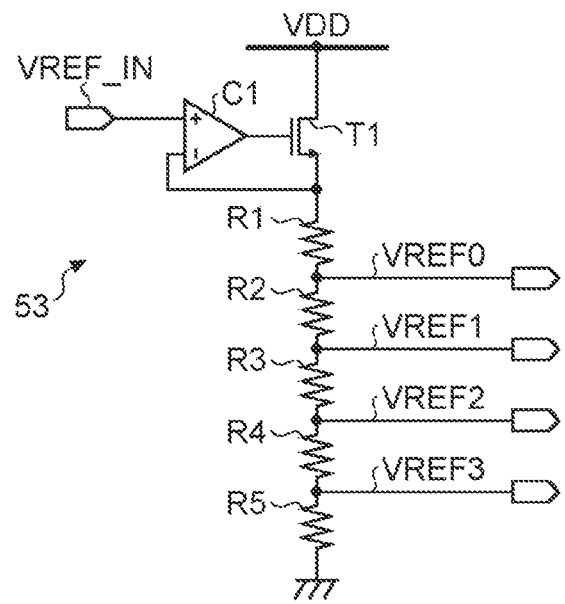
FIG. 14 is a circuit diagram illustrating a schematic configuration example of a DC voltage generation circuit according to a third example of the sixth embodiment.

FIG. 14 is a circuit diagram illustrating a schematic configuration example of a DC voltage generation circuit according to a third example. As illustrated in FIG. 14, a DC voltage generator 53 according to the third example has a configuration similar to the DC voltage generator 52 according to the second example, in which a feedback circuit being a comparator C1 is provided in a gate input stage of the NMOS transistor T1. For example, a separately generated reference voltage VREF_IN is input to the non-inverting input stage of the comparator C1. For example, the source of the NMOS transistor T1 is connected to an inverting input terminal of the comparator C1.

In this manner, with a configuration in which a feedback circuit is provided at the gate of the NMOS transistor T1, it is possible to more accurately control the reference voltages VREF0 to VREF3 extracted from each of connection portions of the resistive elements R1 to R5. The other configurations may be similar to those of the DC voltage generator 52 according to the second example.

6.4 Fourth Example

Figure 15:
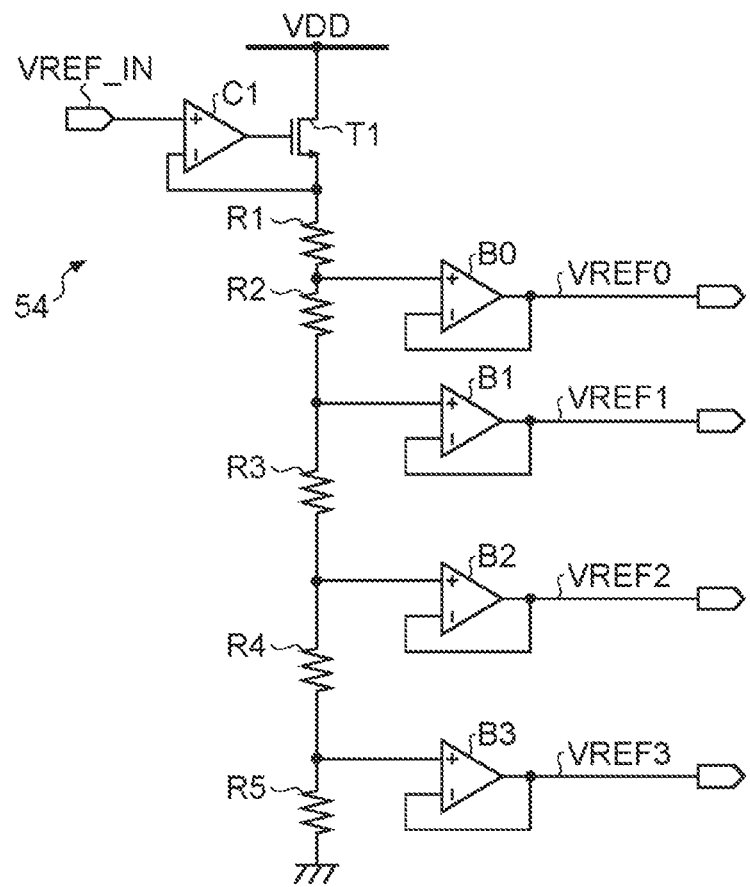
FIG. 15 is a circuit diagram illustrating a schematic configuration example of a DC voltage generation circuit according to a fourth example of the sixth embodiment.

FIG. 15 is a circuit diagram illustrating a schematic configuration example of a DC voltage generation circuit according to a fourth example. As illustrated in FIG. 15, a DC voltage generator 54 according to the fourth example has a configuration similar to the DC voltage generator 53 according to the third example, in which a buffer circuit being one of comparators B0 to B3 is provided for each of wiring lines for extracting reference voltages VREF0 to VREF3 from each of connection portions of the resistive elements R1 to R5. Each of connection portions of the resistive elements R1 to R5 is connected to each of the non-inverting input terminals of the comparators B0 to B3. The outputs of the comparators B0 to B3 are fed back to the inverting input terminals of the comparators B0 to B3, respectively.

In this manner, with a configuration in which a buffer circuit is provided for each of wiring lines for extracting the reference voltages VREF0 to VREF3 from each of connection portions of the resistive elements R1 to R5, it is possible to reduce an output impedance of each of the reference voltages VREF0 to VREF3. This makes it possible to reduce noise and kickback at the time of changeover of switches SW0 to SW3 (switches SWa to SWz in FIG. 11) in the above-described embodiment. The other configurations may be similar to those of the DC voltage generator 53 according to the third example.

7. Application to Indirect TOF Distance Image Sensor

The technique according to the present disclosure is also applicable to an Indirect-Time of Flight (indirect TOF) distance image sensor in addition to the imaging element such as the CMOS image sensor described above. The indirect TOF distance image sensor is a sensor that measures a distance to a target by measuring time-of-flight of light based on a detected phase difference between the light emitted from a light source and the light reflected on the target and that arrived.

7.1 System Configuration Example

Figure 16:
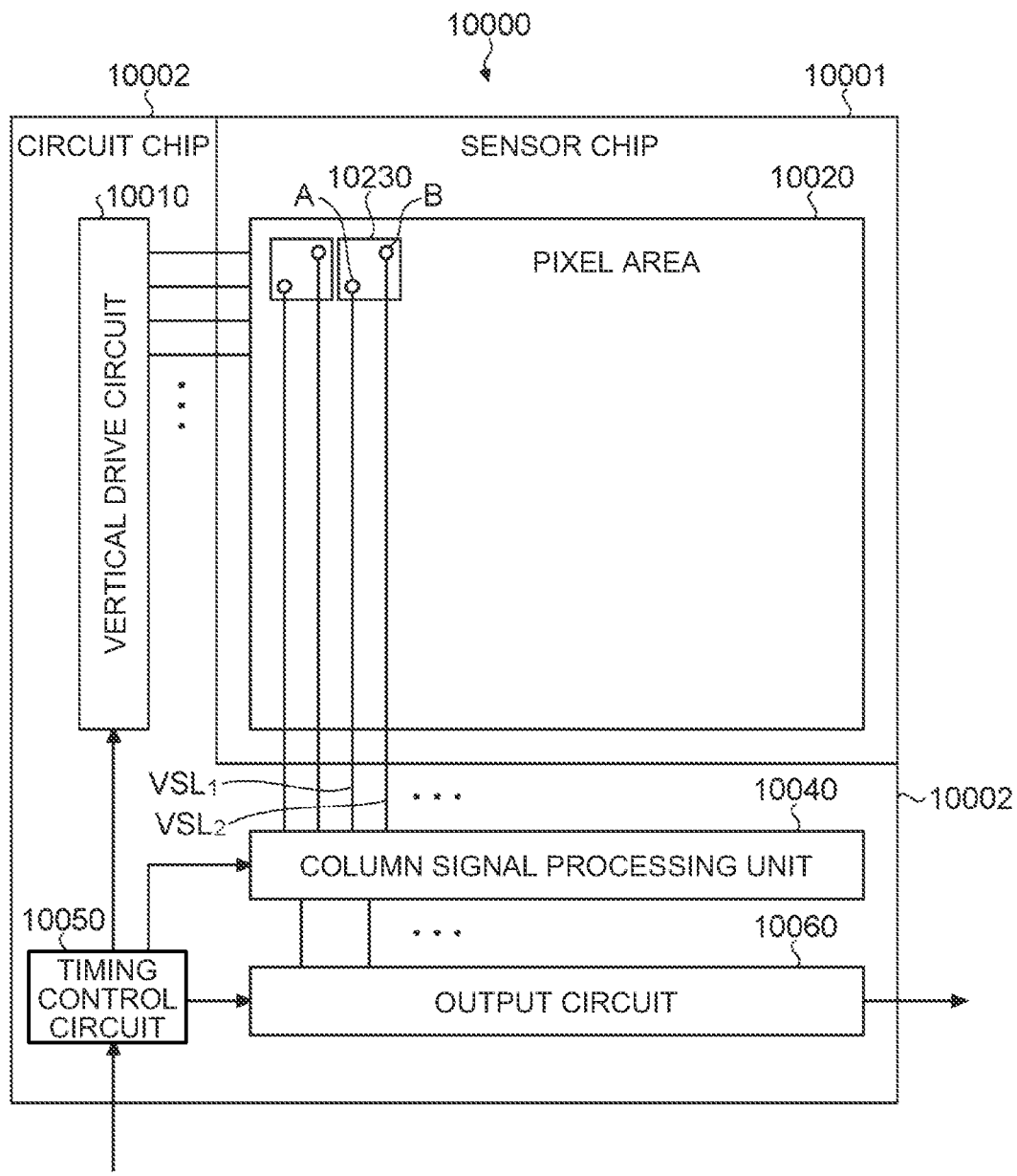
FIG. 16 is a block diagram illustrating an example of a system configuration of an indirect TOF distance image sensor to which the technique according to the present disclosure is applied.

FIG. 16 is a block diagram illustrating an example of a system configuration of an indirect TOF distance image sensor to which the technique according to the present disclosure is applied.

As illustrated in FIG. 16, an indirect TOF distance image sensor 10000 has a stacked structure including a sensor chip 10001 and a circuit chip 10002 stacked on the sensor chip 10001. In this stacked structure, the sensor chip 10001 and the circuit chip 10002 are electrically connected to each other through a connection portion (not illustrated) such as a via or a Cu—Cu connection. FIG. 16 illustrates a state in which the wiring of the sensor chip 10001 and the wiring of the circuit chip 10002 are electrically connected via the above-described connection portion.

There is provided a pixel array unit 10020 formed on the sensor chip 10001. The pixel array unit 10020 includes a plurality of pixels 10230 arranged in a matrix (array) in two-dimensional grid patterns on the sensor chip 10001. In the pixel array unit 10020, each of the plurality of pixels 10230 receives infrared light, performs photoelectric conversion, and outputs an analog pixel signal. In the pixel array unit 10020, two vertical signal lines $VSL_1$ and $VSL_2$ are wired per pixel column. When the number of pixel columns of the pixel array unit 10020 is M (M is an integer), a total of 2×M vertical signal lines VSL are wired to the pixel array unit 10020.

Each of the plurality of pixels 10230 has two taps A and B (details will be described below). Of the two vertical signal lines $VSL_1$ and $VSL_2$, the vertical signal line $VSL_1$ receives an output of a pixel signal $AIN_{P1}$ based on the charge of tap A of the pixel 10230 of the corresponding pixel column, while the vertical signal line $VSL_2$ receives an output of a pixel signal $AIN_{P2}$ based on the charge of tap B of the pixel 10230 of the corresponding pixel column. The pixel signals $AIN_{P1}$ and $AIN_{P2}$ will be described below.

On the circuit chip 10002, there are arranged a vertical drive circuit 10010, a column signal processing unit 10040, an output circuit unit 10060, and a timing controller 10050. The vertical drive circuit 10010 drives individual pixels 10230 of the pixel array unit 10020 in units of pixel rows, and outputs the pixel signals $AIN_{P1}$ and $AIN_{P2}$. Under the drive of the vertical drive circuit 10010, the pixel signals $AIN_{P1}$ and $AIN_{P2}$ output from the pixel 10230 in the selected row are supplied to the column signal processing unit 10040 through the vertical signal lines $VSL_1$ and $VSL_2$.

The column signal processing unit 10040 has a configuration including a plurality of ADCs (corresponding to the above-described column ADCs 10) provided for each of pixel columns, for example, corresponding to the pixel columns of the pixel array unit 10020. Each of the ADCs performs an AD conversion process on the pixel signals $AIN_{P1}$ and $AIN_{P2}$ supplied through the vertical signal lines $VSL_1$ and $VSL_2$, and outputs the processed signals to the output circuit unit 10060. The output circuit unit 10060 executes CDS processing or the like on the digitized pixel signals $AIN_{P1}$ and $AIN_{P2}$ output from the column signal processing unit 10040, and outputs the processed signals to the outside of the circuit chip 10002.

The timing controller 10050 generates various timing signals, clock signals, control signals, or the like, and performs drive control of the vertical drive circuit 10010, the column signal processing unit 10040, the output circuit unit 10060, or the like, based on the generated signals.

7.2 Pixel Circuit Configuration Example

Figure 17:
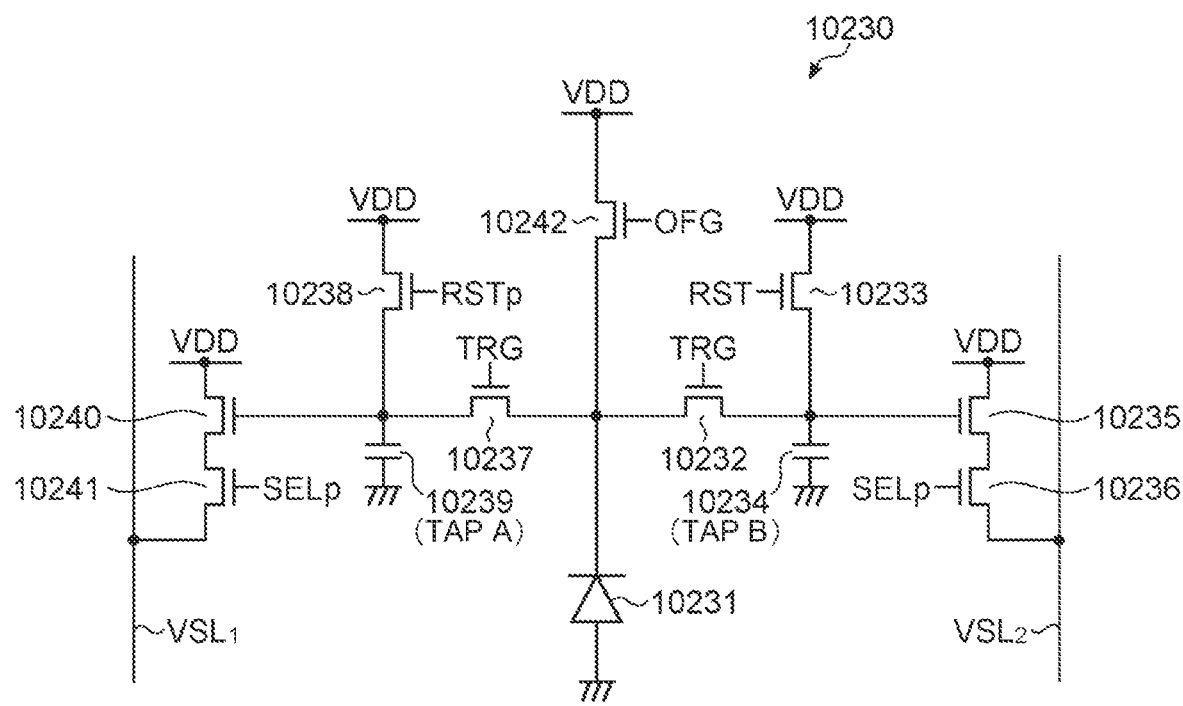
FIG. 17 is a circuit diagram illustrating an example of a pixel circuit configuration in an indirect TOF distance image sensor to which the technique according to the present disclosure is applied.

FIG. 17 is a circuit diagram illustrating an example of a pixel circuit configuration in an indirect TOF distance image sensor to which the technique according to the present disclosure is applied.

The pixel 10230 according to this example includes a photodiode 10231 as a photoelectric conversion unit, for example. The pixel 10230 includes, in addition to the photodiode 10231, an overflow transistor 10242, two transfer transistors 10232 and 10237, two reset transistors 10233 and 10238, two floating diffusion layers 10234 and 10239, two amplification transistors 10235 and 10240, and two selection transistors 10236 and 10241. The two floating diffusion layers 10234 and 10239 correspond to taps A and B illustrated in FIG. 16, respectively.

The photodiode 10231 photoelectrically converts the received light to generate an electric charge. The photodiode 10231 can have a back-illuminated pixel structure. The back-illuminated structure is as described in the pixel structure of the CMOS image sensor. However, the structure is not limited to the back-illuminated type, and it is possible to use a front-illuminated structure that captures the light emitted from the front side of the substrate.

The overflow transistor 10242 is connected between a cathode electrode of the photodiode 10231 and a power supply line of the power supply voltage VDD, and has a function of resetting the photodiode 10231. Specifically, the overflow transistor 10242 becomes conductive in response to an overflow gate signal OFG supplied from the vertical drive circuit 10010, thereby sequentially discharging the electric charge of the photodiode 10231 to the power supply line.

The two transfer transistors 10232 and 10237 are connected between the cathode electrode of the photodiode 10231 and the two floating diffusion layers 10234 and 10239, respectively. The transfer transistors 10232 and 10237 become conductive in response to a transfer signal TRG supplied from the vertical drive circuit 10010, thereby sequentially transferring the charges generated by the photodiode 10231 to the floating diffusion layers 10234 and 10239, respectively.

The floating diffusion layers 10234 and 10239 corresponding to taps A and B respectively accumulate the charge transferred from the photodiode 10231, convert the charge into a voltage signal having a voltage value corresponding to the amount of the charge, and respectively generate pixel signals $AIN_{P1}$ and $AIN_{P2}$.

The two reset transistors 10233 and 10238 are connected between the two floating diffusion layers 10234 and 10239 and the power supply line of the power supply voltage VDD. The reset transistors 10233 and 10238 become conductive in response to a reset signal RST supplied from the vertical drive circuit 10010, thereby extracting charges individually from the floating diffusion layers 10234 and 10239 to initialize the charge amount.

The two amplification transistors 10235 and 10240 are connected between the power supply line of the power supply voltage VDD and each of the two selection transistors 10236 and 10241, and amplify the voltage signals obtained by charge-to-voltage conversion individually in the floating diffusion layers 10234 and 10239, respectively.

The two selection transistors 10236 and 10241 are connected between each of the two amplification transistors 10235 and 10240 and each of the vertical signal lines $VSL_2$ and $VSL_1$. The selection transistors 10236 and 10241 become conductive in response to the selection signal SEL supplied from the vertical drive circuit 10010, thereby outputting the voltage signals respectively amplified by the amplification transistors 10235 and 10240 to the two vertical signal lines $VSL_1$ and $VSL_2$, as the pixel signals $AIN_{P1}$ and $AIN_{P2}$, respectively.

The two vertical signal lines $VSL_1$ and $VSL_2$ are connected to an input end of one ADC in the column signal processing unit 10040 for each of pixel rows, and respectively transmit the pixel signals $AIN_{P1}$ and $AIN_{P2}$ output from the pixel 10230 for each of the pixel columns, to the ADC.

The circuit configuration of the pixel 10230 is not limited to the circuit configuration illustrated in FIG. 17 as long as the circuit configuration can generate the pixel signals $AIN_{P1}$ and $AIN_{P2}$ by photoelectric conversion.

In the indirect TOF distance image sensor 10000 having the above configuration, the technique according to the present disclosure is applicable to each of ADCs provided in the column signal processing unit 10040. That is, the successive approximation type column ADC 10 according to the first to sixth embodiments can be used as each of ADCs of the column signal processing unit 10040.

The embodiments of the present disclosure have been described above. However, the technical scope of the present disclosure is not limited to the above-described embodiments, and various modifications can be made without departing from the scope of the present disclosure. Moreover, it is allowable to combine the components across different embodiment and a modification as appropriate.

The effects described in individual embodiments of the present specification are merely examples, and thus, there may be other effects, not limited to the exemplified effects.

Furthermore, each of the above-described embodiments may be used alone or in combination with other embodiments.

Note that the present technology can also have the following configurations.

(1)

A solid-state imaging apparatus comprising:
a converter connected to a vertical signal line extending from a pixel array unit;
a voltage generator that is connected to a plurality of voltage lines and outputs reference voltages having mutually different voltage values individually to the plurality of voltage lines;
wiring lines connecting the converter and the plurality of voltage lines; and
a switch provided on the wiring line and configured to perform changeover of the voltage lines connected to the converter to one of the plurality of voltage lines.

(2)

The solid-state imaging apparatus according to (1), wherein the converter is a successive approximation type analog-to-digital converter.

(3)

The solid-state imaging apparatus according to (1) or (2), further comprising:
a control line that is connected to the switch and controls a connection state of the switch;
a plurality of the converters;
a plurality of the wiring lines, each of which being connected to one of the plurality of converters; and
a plurality of the switches, each of which being provided in one of the plurality of wiring lines,
wherein the plurality of converters is grouped into a plurality of groups, each of the groups including one or more converters, and
the control line includes: a first control line commonly connected to the switch provided in the wiring line of each of the one or more converters belonging to a first group among the plurality of groups; and a second control line commonly connected to the switch provided in the wiring line of each of the one or more converters belonging to a second group different from the first group among the plurality of groups.

(4) The solid-state imaging apparatus according to (1) or (2), further comprising:
a control line that is connected to the switch and controls a connection state of the switch;
a plurality of the converters;
a plurality of the wiring lines, each of which being connected to one of the plurality of converters; and
a plurality of the switches, each of which being provided in one of the plurality of wiring lines,
wherein the plurality of converters is grouped into a plurality of groups, each of the groups including one or more converters,
a first voltage line out of the plurality of voltage lines is commonly connected to the one or more converters belonging to a first group among the plurality of groups via the wiring line of the one or more converters, and
a second voltage line different from the first voltage line, out of the plurality of voltage lines, is commonly connected to the one or more converters belonging to a second group different from the first group among the plurality of groups via the wiring line of the one or more converters.

(5) The solid-state imaging apparatus according to (3) or (4), wherein a plurality of the vertical signal lines arranged in a row direction extends from the pixel array unit, and
the plurality of groups includes: a first group including the one or more converters connected to even-numbered vertical signal lines among the plurality of vertical signal lines; and a second group including the one or more converters connected to odd-numbered vertical signal lines among the plurality of vertical signal lines.

(6) The solid-state imaging apparatus according to (3) or (4), wherein a plurality of the vertical signal lines arranged in a row direction extends from the pixel array unit, and
the plurality of converters is grouped for each of two or more vertical signal lines adjacent to each other in the row direction such that the one or more converters connected to the vertical signal lines are to be grouped into one group.

(7) The solid-state imaging apparatus according to (3) or (4), wherein a plurality of the vertical signal lines arranged in a row direction extends from the pixel array unit, and
the plurality of converters is grouped for each of vertical signal lines arranged every three or more lines in the row direction such that the one or more converters connected to the vertical signal lines are to be grouped into one group.

(8) The solid-state imaging apparatus according to any one of (3) to (7), wherein the plurality of converters is arranged in multiple stages for each of the groups on one side with respect to the pixel array unit.

(9) The solid-state imaging apparatus according to any one of (3) to (7),
wherein the one or more converters belonging to one group among the plurality of groups are arranged on a first side with respect to the pixel array unit, and the one or more converters belonging to another group other than the one group among the plurality of groups are arranged on a second side opposite to the first side, with respect to the pixel array unit.

(10) The solid-state imaging apparatus according to any one of (1) to (10),
wherein the voltage generator is a voltage divider circuit in which a plurality of resistive elements is connected in series between a power supply voltage and ground, and
the reference voltages of the mutually different voltage values are output from connection portions of the plurality of resistive elements.

(11) The solid-state imaging apparatus according to (10), wherein the voltage generator further includes a transistor connected in series between the power supply voltage and the resistive element.

(12) The solid-state imaging apparatus according to (11), wherein the voltage generator further includes a feedback circuit provided at a gate of the transistor.

(13) The solid-state imaging apparatus according to (12), wherein the voltage generator further includes a buffer circuit provided in each of the wiring lines extending from each of the connection portions of the plurality of resistive elements.

(14) An electronic apparatus comprising a solid-state imaging apparatus including: a converter connected to a vertical signal line extending from a pixel array unit; a voltage generator that is connected to a plurality of voltage lines and outputs reference voltages having mutually different voltage values individually to the plurality of voltage lines; wiring lines connecting the converter and the plurality of voltage lines; and a switch provided on the wiring line and configured to perform changeover of the voltage lines connected to the converter to one of the plurality of voltage lines.

REFERENCE SIGNS LIST 1, 1A SOLID-STATE IMAGING APPARATUS
10, 10A to 10D COLUMN ADC
11 COMPARATOR
12 SAR LOGIC CIRCUIT
13 COLUMN I/F UNIT
14 CLOCK/CONTROL LOGIC BUFFER
15 SWITCH GROUP
16 REFERENCE VOLTAGE GENERATION CIRCUIT
17 DA CONVERSION CIRCUIT
171 CAPACITOR GROUP
172 SWITCH GROUP
173 WIRING
20, 21, 51 to 54 DC VOLTAGE GENERATOR
30 PIXEL ARRAY UNIT
31 UNIT PIXEL
40 VERTICAL DRIVE CIRCUIT
10000 INDIRECT TOF DISTANCE IMAGE SENSOR
10001 SENSOR CHIP
10002 CIRCUIT CHIP
10010 VERTICAL DRIVE CIRCUIT
10020 PIXEL ARRAY UNIT
10040 COLUMN SIGNAL PROCESSING UNIT
10050 TIMING CONTROLLER
10060 OUTPUT CIRCUIT UNIT
10230 PIXEL
10231 PHOTODIODE
10232, 10237 TRANSFER TRANSISTOR
10233, 10238 RESET TRANSISTOR
10234 FLOATING DIFFUSION LAYER (TAP A)

10235, 10240 AMPLIFICATION TRANSISTOR
10236, 10241 SELECTION TRANSISTOR
10239 FLOATING DIFFUSION LAYER (TAP B)
10242 OVERFLOW TRANSISTOR
B0 to B3 COMPARATOR (BUFFER CIRCUIT)
C1 COMPARATOR (FEEDBACK CIRCUIT)
L1, L2 VOLTAGE LINE
L10 to L13, L20 to L23 WIRING LINE
L30, L31, L32 CONTROL LINE
P1, P2 GROUP
P1 to R5 RESISTIVE ELEMENT
SW0 to SW3, SWa to SWz SWITCH
T1 NMOS TRANSISTOR
$VSL_1$, $VSL_2$ VERTICAL SIGNAL LINE

The invention claimed is:

1. A solid-state imaging apparatus comprising:
   a converter connected to a vertical signal line extending from a pixel array unit;
   a voltage generator that is connected to a plurality of voltage lines and outputs reference voltages having mutually different voltage values individually to the plurality of voltage lines;
   a plurality of wiring lines connecting the converter and the plurality of voltage lines; and
   a switch provided on a wiring line of the wiring lines and configured to perform changeover of the voltage lines connected to the converter to one of the plurality of voltage lines.

2. The solid-state imaging apparatus according to claim 1, wherein the converter is a successive approximation type analog-to-digital converter.

3. The solid-state imaging apparatus according to claim 1, further comprising:
   a control line that is connected to the switch and controls a connection state of the switch;
   a plurality of converters, wherein each of the plurality of wiring being connected to one of the plurality of converters; and
   a plurality of switches, each of which being provided in one of the plurality of wiring lines,
   wherein the plurality of converters is grouped into a plurality of groups, each of the groups including one or more converters, and
   the control line includes: a first control line commonly connected to the switch provided in the wiring line of each of the one or more converters belonging to a first group among the plurality of groups; and a second control line commonly connected to the switch provided in the wiring line of each of the one or more converters belonging to a second group different from the first group among the plurality of groups.

4. The solid-state imaging apparatus according to claim 1, further comprising:
   a control line that is connected to the switch and controls a connection state of the switch;
   a plurality of converters, wherein each of the plurality of wiring being connected to one of the plurality of converters; and
   a plurality of switches, each of which being provided in one of the plurality of wiring lines,
   wherein the plurality of converters is grouped into a plurality of groups, each of the groups including one or more converters,
   a first voltage line out of the plurality of voltage lines is commonly connected to the one or more converters belonging to a first group among the plurality of groups via the wiring line of the one or more converters, and
   a second voltage line different from the first voltage line, out of the plurality of voltage lines, is commonly connected to the one or more converters belonging to a second group different from the first group among the plurality of groups via the wiring line of the one or more converters.

5. The solid-state imaging apparatus according to claim 3, wherein a plurality of vertical signal lines arranged in a row direction extends from the pixel array unit, and
   the plurality of groups includes: a first group including the one or more converters connected to even-numbered vertical signal lines among the plurality of vertical signal lines; and a second group including the one or more converters connected to odd-numbered vertical signal lines among the plurality of vertical signal lines.

6. The solid-state imaging apparatus according to claim 3, wherein a plurality of vertical signal lines arranged in a row direction extends from the pixel array unit, and
   the plurality of converters is grouped for each of two or more vertical signal lines adjacent to each other in the row direction such that the one or more converters connected to the vertical signal lines are to be grouped into one group.

7. The solid-state imaging apparatus according to claim 3, wherein a plurality of vertical signal lines arranged in a row direction extends from the pixel array unit, and
   the plurality of converters is grouped for each of vertical signal lines arranged every three or more lines in the row direction such that the one or more converters connected to the vertical signal lines are to be grouped into one group.

8. The solid-state imaging apparatus according to claim 3, wherein the plurality of converters is arranged in multiple stages for each of the groups on one side with respect to the pixel array unit.

9. The solid-state imaging apparatus according to claim 3, wherein the one or more converters belonging to one group among the plurality of groups are arranged on a first side with respect to the pixel array unit, and the one or more converters belonging to another group other than the one group among the plurality of groups are arranged on a second side opposite to the first side, with respect to the pixel array unit.

10. The solid-state imaging apparatus according to claim 1,
    wherein the voltage generator is a voltage divider circuit in which a plurality of resistive elements is connected in series between a power supply voltage and ground, and
    the reference voltages of the mutually different voltage values are output from connection portions of the plurality of resistive elements.

11. The solid-state imaging apparatus according to claim 10,
    wherein the voltage generator further includes a transistor connected in series between the power supply voltage and a resistive element.

12. The solid-state imaging apparatus according to claim 11,
    wherein the voltage generator further includes a feedback circuit provided at a gate of the transistor.

13. The solid-state imaging apparatus according to claim 12,
    wherein the voltage generator further includes a buffer circuit provided in each of the plurality of wiring lines extending from each of the connection portions of the plurality of resistive elements.

14. An electronic apparatus comprising:
a solid-state imaging apparatus including:
- a converter connected to a vertical signal line extending from a pixel array unit;
- a voltage generator that is connected to a plurality of voltage lines and outputs reference voltages having mutually different voltage values individually to the plurality of voltage lines;
- a plurality of wiring lines connecting the converter and the plurality of voltage lines; and
- a switch provided on a wiring line of the plurality of wiring lines and configured to perform changeover of the voltage lines connected to the converter to one of the plurality of voltage lines.

* * * * *